US012712036B2

(12) United States Patent
Woo

(10) Patent No.: US 12,712,036 B2
(45) Date of Patent: Aug. 18, 2026

(54) MEMORY DEVICE AND METHOD OF OPERATING THE SAME

(71) Applicant: SK hynix Inc., Icheon-si (KR)

(72) Inventor: Chang Beom Woo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 249 days.

(21) Appl. No.: 18/231,127

(22) Filed: Aug. 7, 2023

(65) Prior Publication Data

US 2024/0282394 A1 Aug. 22, 2024

(30) Foreign Application Priority Data

Feb. 22, 2023 (KR) ........................ 10-2023-0023781

(51) Int. Cl.

*G11C 16/34* (2006.01)
*G11C 16/04* (2006.01)
*G11C 16/10* (2006.01)
*G11C 16/16* (2006.01)

(52) U.S. Cl.

CPC ........ *G11C 16/349* (2013.01); *G11C 16/0483* (2013.01); *G11C 16/10* (2013.01); *G11C 16/16* (2013.01)

(58) Field of Classification Search

CPC ... G11C 16/349; G11C 16/0483; G11C 16/10; G11C 16/16
USPC ..................................................... 365/185.09
See application file for complete search history.

(56) References Cited

U.S. PATENT DOCUMENTS

2005/0236662 A1* 10/2005 Lee ........................ H10D 30/69 257/E21.21
2007/0268749 A1* 11/2007 Kim .................. G11C 16/0483 365/185.29
2013/0279257 A1* 10/2013 Costa ....................... G11C 5/02 365/185.17
2016/0133328 A1* 5/2016 Oh ...................... G11C 11/5621 365/185.28
2017/0053869 A1* 2/2017 Sakata ................ H01L 21/3065
2019/0051355 A1* 2/2019 Lee .................... G11C 16/3459
2021/0174879 A1* 6/2021 Hioka ................. G11C 11/5635
2023/0154551 A1* 5/2023 Ko ..................... G11C 16/3445 365/185.22
2024/0105265 A1* 3/2024 Yang ...................... G11C 16/14

FOREIGN PATENT DOCUMENTS

KR 100776901 B1 11/2007
KR 1020130072665 A 7/2013

* cited by examiner

*Primary Examiner* — Alexander Sofocleous
*Assistant Examiner* — Duy H Luong
(74) *Attorney, Agent, or Firm* — WILLIAM PARK AND ASSOCIATES LTD.

(57) ABSTRACT

Provided herein may be a memory device and a method of operating the same. The memory device may include a memory block including a plurality of memory strings, a peripheral circuit configured to perform an erase operation and a program operation on the memory block, and a control logic configured to control the peripheral circuit to perform the erase operation and the program operation on the memory block, wherein the control logic is configured to control the peripheral circuit to perform an abnormally injected electron removal operation that removes abnormally injected electrons trapped in a charge storage layer of a plurality of memory cells included in the memory block after the erase operation has been completed.

18 Claims, 12 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2023-0023781 filed on Feb. 22, 2023, in the Korean Intellectual Property Office, the entire disclosure of which is incorporated by reference herein.

BACKGROUND

1. Technical Field

Various embodiments of the present disclosure relate to an electronic device, and more particularly to a memory device and a method of operating the memory device.

2. Related Art

Semiconductor devices, in particular, memory devices are roughly classified into volatile memory devices and nonvolatile memory devices.

Nonvolatile memory devices have relatively low write and read speeds but retain data stored therein even when the supply of power is interrupted. Therefore, nonvolatile memory devices are used to store data to be retained regardless of whether power is supplied. Representative examples of the nonvolatile memory device include read-only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), ferroelectric RAM (FRAM), etc. The flash memory is classified into a NOR type and a NAND type.

The flash memory has both the advantage of RAM in which data is freely programmable and erasable and the advantage of ROM in which data stored therein can be retained even when the supply of power is interrupted. Such a flash memory is widely used as a storage medium for portable electronic devices, such as a digital camera, a personal digital assistant (PDA), and an MP3 player.

SUMMARY

An embodiment of the present disclosure may provide for a memory device. The memory device may include a memory block including a plurality of memory strings, a peripheral circuit configured to perform an erase operation and a program operation on the memory block, and a control logic configured to control the peripheral circuit to perform the erase operation and the program operation on the memory block, wherein the control logic is configured to control the peripheral circuit to perform an abnormally injected electron removal operation that removes abnormally injected electrons trapped in a charge storage layer of a plurality of memory cells included in the memory block after the erase operation has been completed.

An embodiment of the present disclosure may provide for a memory device. The memory device may include a memory block including a plurality of memory strings, a peripheral circuit configured to perform an erase operation and a program operation on the memory block, and a control logic configured to control the peripheral circuit to perform the erase operation and the program operation on the memory block, wherein the control logic is configured to control the peripheral circuit to perform an abnormally injected electron removal operation on the memory block in an erase state before the program operation is performed on the memory block, and wherein the abnormally injected electron removal operation is an operation that removes abnormally injected electrons trapped in a charge storage layer of a plurality of memory cells included in the memory block.

An embodiment of the present disclosure may provide for a method of operating a memory device. The method may include receiving an erase command from an external device of the memory device, and performing an erase operation on a selected memory block in response to the received erase command, and performing an abnormally injected electron removal operation on the selected memory block on which the erase operation has been completed, wherein the abnormally injected electron removal operation is an operation that removes abnormally injected electrons trapped in a charge storage layer of memory cells included in the selected memory block due to a back-tunneling phenomenon during the erase operation.

An embodiment of the present disclosure may provide for a method of operating a memory device. The method may include receiving a program command from an external device of the memory device and performing an abnormally injected electron removal operation on a selected memory block in response to the received program command, and performing a program operation on the selected memory block on which the abnormally injected electron removal operation has been completed, wherein the abnormally injected electron removal operation is an operation that removes abnormally injected electrons trapped in a charge storage layer of memory cells included in the selected memory block due to a back-tunneling phenomenon during the erase operation.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Various embodiments of the present disclosure will now be described in detail with reference to the accompanying drawings so that those skilled in the art can easily practice the technical spirit of the present disclosure.

Various embodiments of the present disclosure are directed to a memory device that is capable of minimizing deterioration of threshold voltage distributions of a memory device and a method of operating the memory device.

Figure 1:
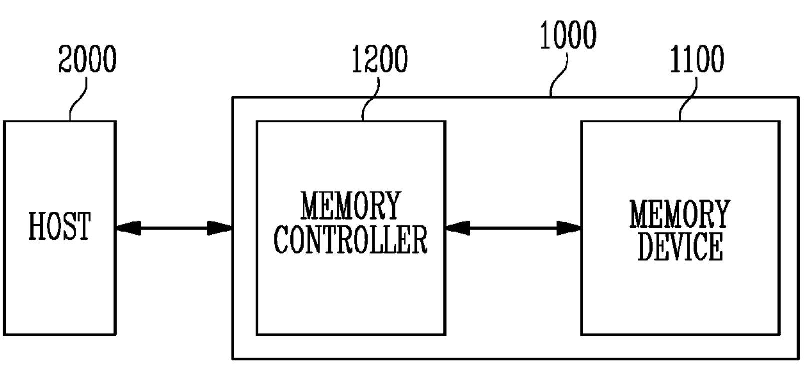
FIG. 1 is a diagram illustrating a memory system according to an embodiment of the present disclosure.

FIG. 1 is a diagram illustrating a memory system according to an embodiment of the present disclosure.

Referring to FIG. 1, a memory system 1000 may include a memory device 1100 that stores data, and a memory controller 1200 that controls the memory device 1100 under the control of a host 2000.

The host 2000 may communicate with the memory system 1000 by using an interface protocol, such as peripheral component interconnect-express (PCI-E), advanced technology attachment (ATA), serial ATA (SATA), parallel ATA (PATA) or serial attached SCSI (SAS). In addition, the interface protocol between the host 2000 and the memory system 1000 is not limited to the above-described examples and may be one of various interface protocols, such as universal serial bus (USB), multi-media card (MMC), enhanced small disk interface (ESDI), and integrated drive electronics (IDE).

The memory controller 1200 may control the overall operation of the memory system 1000 and may control data exchange between the host 2000 and the memory device 1100. For example, the memory controller 1200 may program or read data by controlling the memory device 1100 in response to a request received from the host 2000. In an embodiment, the memory device 1100 may include a double data rate synchronous dynamic random access memory (DDR SDRAM), a low power double data rate 4 (LPDDR4) SDRAM, a graphics double data rate (GDDR) SDRAM, a low power DDR (LPDDR) SDRAM, a Rambus DRAM (RDRAM) or a flash memory.

The memory device 1100 may perform a program operation, a read operation or an erase operation under the control of the memory controller 1200. The program operation or the erase operation may include an abnormally injected electron removal operation that removes electrons abnormally injected into a charge storage layer of memory cells.

Figure 2:
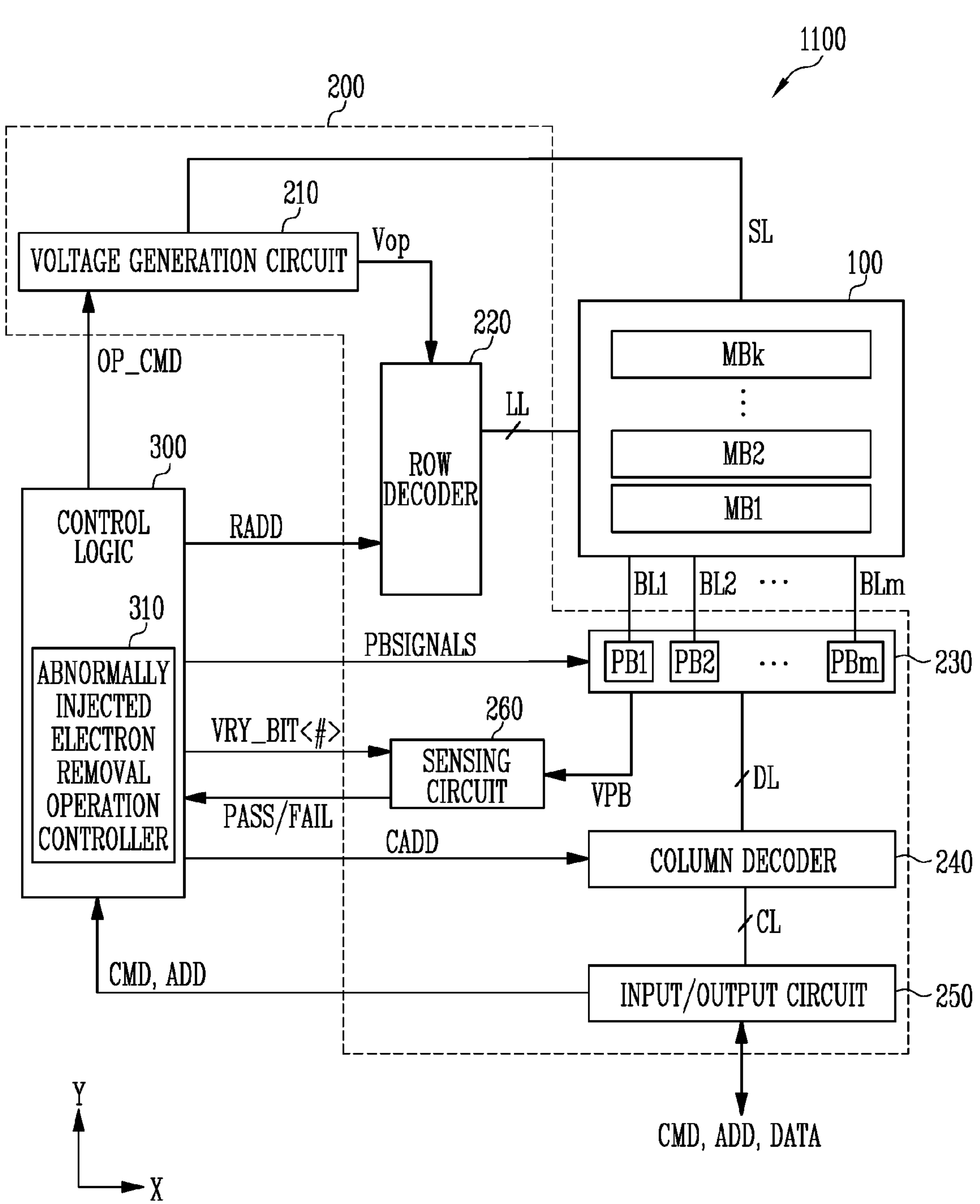
FIG. 2 is a diagram illustrating a memory device of FIG. 1.

FIG. 2 is a diagram illustrating the memory device of FIG. 1.

Referring to FIG. 2, the memory device 1100 may include a memory cell array 100 in which data is stored. The memory device 1100 may include peripheral circuits 200 configured to perform a program operation that stores data in the memory cell array 100, a read operation that outputs the stored data, and an erase operation that erases the stored data. The memory device 1100 may include a control logic 300 that controls the peripheral circuits 200 under the control of a memory controller (e.g., 1200 of FIG. 1).

The memory cell array 100 may include a plurality of memory blocks MB1 to MBk (k is a positive integer). Local lines LL and bit lines BL1 to BLm (where m is a positive integer) may be coupled to each of the memory blocks MB1 to MBk. For example, the local lines LL may include a first select line, a second select line, and a plurality of word lines arranged between the first and second select lines. Also, the local lines LL may include dummy lines arranged between the first select line and the word lines and between the second select line and the word lines. Here, the first select line may be a source select line, and the second select line may be a drain select line. For example, the local lines LL may include the word lines, the drain and source select lines, and source lines. For example, the local lines LL may further include the dummy lines. For example, the local lines LL may further include pipelines. According to an embodiment of the present disclosure, the word lines may be divided into a plurality of groups.

The local lines LL may be coupled to each of the memory blocks MB1 to MBk, and the bit lines BL1 to BLm may be coupled in common to the memory blocks MB1 to MBk. The memory blocks MB1 to MBK may be implemented in a two-dimensional (2D) or three-dimensional (3D) structure. For example, pages in the memory blocks having a 2D structure may be horizontally arranged on a substrate. For example, pages in the memory blocks having a 3D structure may be vertically arranged on a substrate.

The peripheral circuits 200 may perform program, read, and erase operations on a selected memory block under the control of the control logic 300. For example, the peripheral circuits 200 may supply a verify voltage and a pass voltage to the first select line, the second select line, and the word lines, may selectively discharge the first select line, the second select line, and the word lines, and may verify memory cells coupled to a selected word line among the word lines, under the control of the control logic 300. For example, the peripheral circuits 200 may include a voltage generation circuit 210, a row decoder 220, a page buffer group 230, a column decoder 240, an input/output circuit 250, and a sensing circuit 260.

The voltage generation circuit 210 may generate various operating voltages Vop that are used for program, read, and erase operations in response to an operation signal OP_CMD. Further, the voltage generation circuit 210 may selectively discharge the local lines LL in response to the operation signal OP_CMD. For example, the voltage generation circuit 210 may generate a program voltage, a verify voltage, a pass voltage, a turn-on voltage, a read voltage, an erase voltage, a source line voltage, etc. under the control of the control logic 300. Further, the voltage generation circuit 210 may generate a hot-hole generation voltage to be applied to the source line of the memory cell array 100, a ground voltage to be applied to the word lines of the memory cell array 100, and a turn-off voltage to be applied to the first select line and the second select line of the selected memory block during an abnormally injected electron removal operation included in a program operation or an erase operation.

The row decoder 220 may transfer the operating voltages Vop to the local lines LL coupled to the selected memory block in response to a row address RADD.

The page buffer group 230 may include a plurality of page buffers PB1 to PBm coupled to the bit lines BL1 to BLm, respectively. The page buffers PB1 to PBm may be operated in response to page buffer control signals PBSIGNALS. For example, the page buffers PB1 to PBm may temporarily store data received through the bit lines BL1 to BLm or may sense voltages or currents of the bit lines BL1 to BLm during a read or verify operation. Furthermore, the page buffer group 230 may apply the hot-hole generation voltage to the bit lines BL1 to BLm of the memory cell array 100 during the abnormally injected electron removal operation.

The column decoder 240 may transfer data between the input/output circuit 250 and the page buffer group 230 in response to a column address CADD. For example, the column decoder 240 may exchange data with the page buffers PB1 to PBm through data lines DL or may exchange data with the input/output circuit 250 through column lines CL.

The input/output circuit 250 may transfer a command CMD and an address ADD, received from the memory controller (e.g., 1200 of FIG. 1), to the control logic 300 or may exchange data DATA with the column decoder 240.

During a read or verify operation, the sensing circuit 260 may generate a reference current in response to an enable bit VRY_BIT< #>, compare a sensing voltage VPB, received from the page buffer group 230, with a reference voltage generated by the reference current, and then output a pass signal PASS or a fail signal FAIL.

The control logic 300 may output the operation signal OP_CMD, the row address RADD, the page buffer control signals PBSIGNALS, and the enable bit VRY_BIT< #> in response to the command CMD and the address ADD and may then control the peripheral circuits 200. In addition, the control logic 300 may determine whether a verify operation has passed or failed in response to the pass or fail signal PASS or FAIL.

The control logic 300 may control the peripheral circuits 200 to perform an abnormally injected electron removal operation during a program operation or an erase operation. According to an embodiment, the control logic 300 may control the peripheral circuits 200 such that, when a command CMD corresponding to an erase operation is received, an erase operation that decreases the threshold voltages of memory cells included in a selected memory block to a level lower than a target threshold voltage may be performed. After the erase operation, an abnormally injected electron removal operation that removes abnormally injected electrons trapped in the charge storage layer of the memory cells may be performed. In an embodiment, the control logic 300 may control the peripheral circuits 200 such that, when a command CMD corresponding to a program operation is received, an abnormally injected electron removal operation that removes abnormally injected electrons trapped in the charge storage layer of the memory cells included in the selected memory block may be performed before a program operation is performed on the selected memory block. The abnormally injected electron removal operation may be performed by increasing the channel potential of the selected memory block. For example, the abnormally injected electron removal operation may increase a channel potential by using a gate-induced drain leakage (GIDL) method or by directly applying a high voltage to a bit line or a source line.

According to an embodiment, the control logic 300 may include an abnormally injected electron removal operation controller 310. The abnormally injected electron removal operation controller 310 may control the peripheral circuits 200 to perform an abnormally injected electron removal operation during an erase operation or a program operation. For example, after decreasing the threshold voltages of memory cells to a level lower than a target level and then erasing the memory cells by applying an erase voltage to the selected memory block during the erase operation, the abnormally injected electron removal operation controller 310 may control the voltage generation circuit 210, the row decoder 220, and the page buffer group 230 to apply a hot-hole generation voltage to either or both of the bit lines BL1 to BLm and the source line SL that are coupled to the selected memory block, may control the voltage generation circuit 210 and the row decoder 220 to apply the hot-hole generation voltage to the first select line and the second select line of the selected memory block, and may control the voltage generation circuit 210 and the row decoder 220 to apply a ground voltage to the word lines of the selected memory block.

Figure 3:
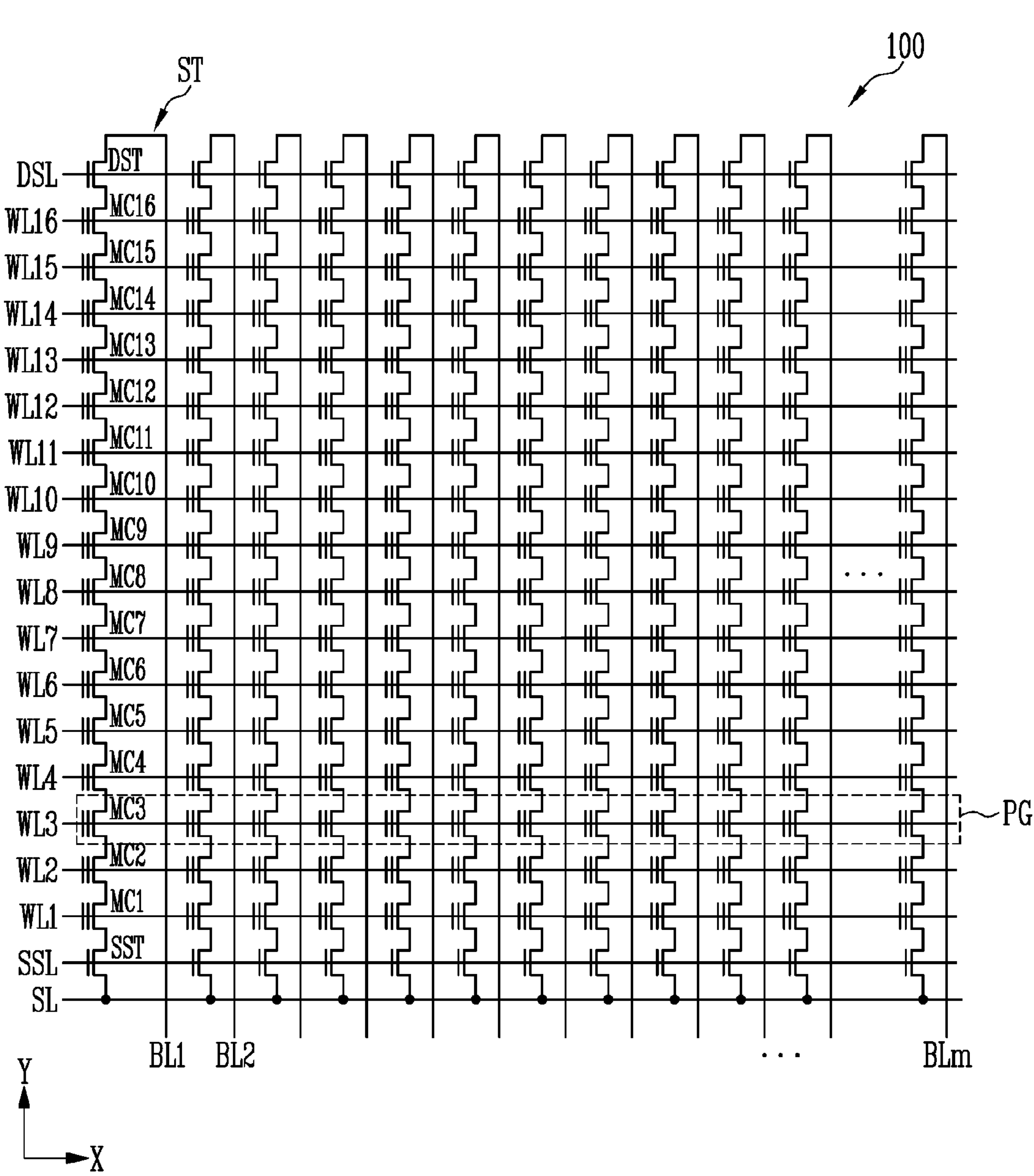
FIG. 3 is a diagram illustrating a memory block of FIG. 2.

FIG. 3 is a diagram illustrating the memory block of FIG. 2.

Referring to FIG. 3, a plurality of word lines arranged in parallel between a first select line and a second select line may be coupled to the memory block. Here, the first select line may be a source select line SSL, and the second select line may be a drain select line DSL. In detail, the memory block may include a plurality of memory strings ST coupled between bit lines BL1 to BLm and a source line SL. The bit lines BL1 to BLm may be coupled to the memory strings ST, respectively, and the source line SL may be coupled in common to the memory strings ST. The memory strings ST may be configured in the same manner, and thus, the memory string ST coupled to the first bit line BL1 will be described in detail by way of an example.

The memory string ST may include a source select transistor SST, a plurality of memory cells MC1 to MC16, and a drain select transistor DST, which are coupled in series to each other between the source line SL and the first bit line BL1. One memory string ST may include at least one source select transistor SST and at least one drain select transistor DST and may include more memory cells than the memory cells MC1 to MC16, illustrated in FIG. 3.

A source of the source select transistor SST may be coupled to the source line SL, and a drain of the drain select transistor DST may be coupled to the first bit line BL1. The memory cells MC1 to MC16 may be coupled in series between the source select transistor SST and the drain select transistor DST. Gates of the source select transistors SST included in different memory strings ST may be coupled to the source select line SSL, gates of the drain select transistors DST included in different memory strings ST may be coupled to the drain select line DSL, and gates of the memory cells MC1 to MC16 may be coupled to a plurality of word lines WL1 to WL16, respectively. A group of memory cells coupled to the same word line, among the memory cells included in different memory strings ST, may be referred to as a 'page (PG)'. Therefore, the memory block may include a number of pages (PG) identical to the number of word lines WL1 to WL16.

Figure 4:
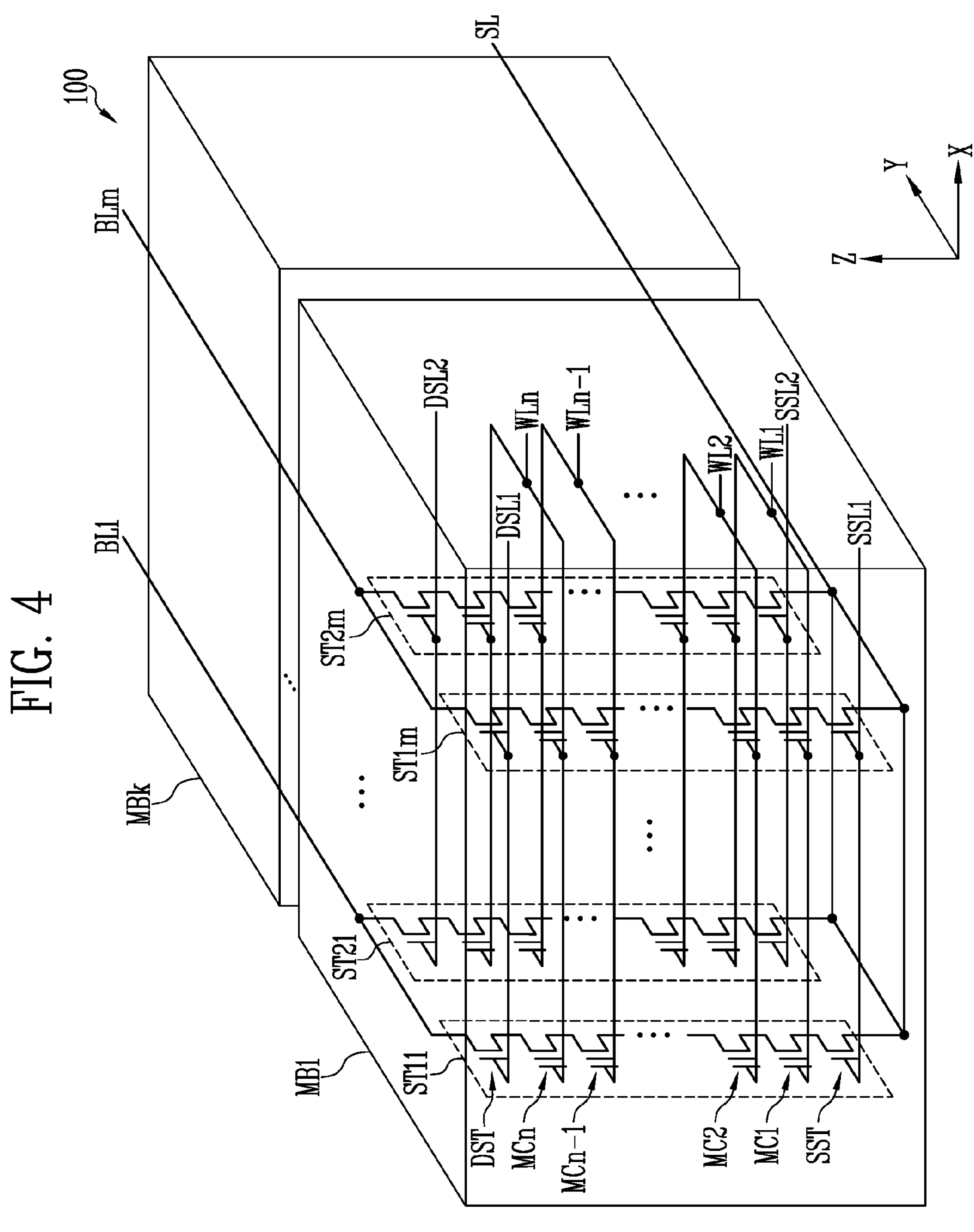
FIG. 4 is a diagram illustrating an example of a memory block having a three-dimensional (3D) structure.

FIG. 4 is a diagram illustrating an example of a memory block having a three-dimensional (3D) structure.

Referring to FIG. 4, a memory cell array 100 may include a plurality of memory blocks MB1 to MBk. In FIG. 4, for better understanding of description, the internal configuration of the first memory block MB1 is illustrated, and the internal configuration of the remaining memory blocks MB2 to MBk has been omitted. The second to k-th memory blocks MB2 to MBk may be configured in the same manner as the first memory block MB1.

The first memory block MB1 may include a plurality of memory strings ST11 to ST1*m* and ST21 to ST2*m*. Each of the memory strings ST11 to ST1*m* and ST21 to ST2*m* may extend along a vertical direction (e.g., Z direction). In the first memory block MB1, m memory strings may be arranged in a row direction (e.g., an X direction). Although, in FIG. 4, two memory strings are illustrated as being arranged in a column direction (e.g., Y direction), this embodiment is provided for convenience of description, and three or more memory strings may be arranged in the column direction (e.g., Y direction) in other embodiments.

Each of the memory strings ST11 to ST1*m* and ST21 to ST2*m* may include at least one source select transistor SST, first to n-th memory cells MC1 to MCn, and at least one drain select transistor DST.

The source select transistor SST of each memory string may be coupled between a source line SL and the memory cells MC1 to MCn. Source select transistors of memory strings arranged in the same row may be coupled to the same source select line. The source select transistors of the memory strings ST11 to ST1*m* arranged in a first row may be coupled to a first source select line SSL1. The source select transistors of the memory strings ST21 to ST2*m* arranged in a second row may be coupled to a second source select line SSL2. In other embodiments, the source select transistors of the memory strings ST11 to ST1*m* and ST21 to ST2*m* may be coupled in common to one source select line.

The first to n-th memory cells MC1 to MCn in each memory string may be coupled in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding memory string may be stably controlled. Therefore, the reliability of data stored in the memory block MB1 may be improved.

The drain select transistor DST of each memory string may be coupled between the corresponding bit line and the memory cells MC1 to MCn. The drain select transistors DST of memory strings arranged in the row direction may be coupled to a drain select line extending along the row direction. The drain select transistors DST of the memory strings ST11 to ST1*m* in the first row may be coupled to a first drain select line DSL1, The drain select transistors DST of the memory strings ST21 to ST2*m* in the second row may be coupled to a second drain select line DSL2.

Figure 5:
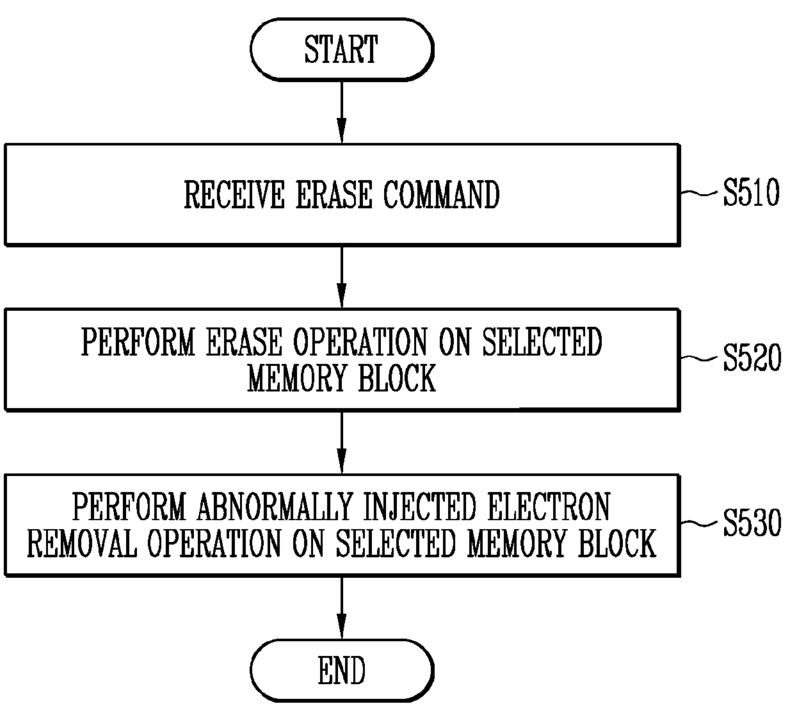
FIG. 5 is a flowchart illustrating an erase operation of a memory device according to an embodiment of the present disclosure.

FIG. 5 is a flowchart illustrating an erase operation of a memory device according to an embodiment of the present disclosure.

A method of performing an erase operation on a memory device according to an embodiment of the present disclosure will be described below with reference to FIGS. 1 to 5.

At step S510, the memory device 1100 may receive a command CMD corresponding to the erase operation and an address ADD corresponding to a memory block on which the erase operation is to be performed. The command CMD and the address ADD may be received from the memory controller 1200.

The control logic 300 of the memory device 1100 may control the peripheral circuits 200, specifically, the input/output circuit 250, to output the command CMD and the address ADD corresponding to the erase operation to the control logic 300 and to perform the erase operation on a selected memory block (e.g., MB1) corresponding to the address ADD.

At step S520, the peripheral circuits 200 may perform the erase operation on the selected memory block MB1 under the control of the control logic 300. For example, the voltage generation circuit 210 may apply an erase voltage to the source line SL coupled to the selected memory block MB1 in response to an operation signal OP_CMD. The row decoder 220 may control the word lines WL1 to WLn of the selected memory block MB1 to float and may apply a select line voltage (e.g., a ground voltage) to each of the drain select line DSL and the source select line SSL. Therefore, in a lower channel of the source select transistor SST of the selected memory block MB1, a GIDL current may be generated by the erase voltage applied through the source line SL, and hot holes generated through the GIDL current may be supplied to the channel layer of the plurality of memory strings. Thereafter, when the row decoder 220 discharges the potential levels of the word lines WL1 to WLn to the level of the ground voltage, a voltage difference between the word lines WL1 to WLn and the channels of the memory strings included in the selected memory block MB1 may be sufficiently increased, whereby electrons trapped in the charge storage layer of the memory cells MC1 to MCn included in the selected memory block MB1 are emitted to the channels, thus decreasing the threshold voltages of the memory cells. Accordingly, pieces of data stored in the memory cells MC1 to MCn included in the selected memory block MB1 may be erased.

After the above-described step S520 has been completed, an abnormally injected electron removal operation may be performed on the selected memory block at step S530. During the erase operation on the selected memory block, the level of a channel potential may be increased by the high-potential erase voltage applied to the source line SL, and a back-tunneling phenomenon in which electrons are injected from the gate electrodes of the memory cells may occur due to the increase in the channel potential level. The electrons injected due to the back-tunneling phenomenon may be trapped in the charge storage layer of the memory cells, thus deteriorating threshold voltage distributions of erased memory cells.

The abnormally injected electron removal operation may remove abnormally injected electrons that are trapped in the charge storage layer due to back tunneling during the erase operation.

Figure 6:
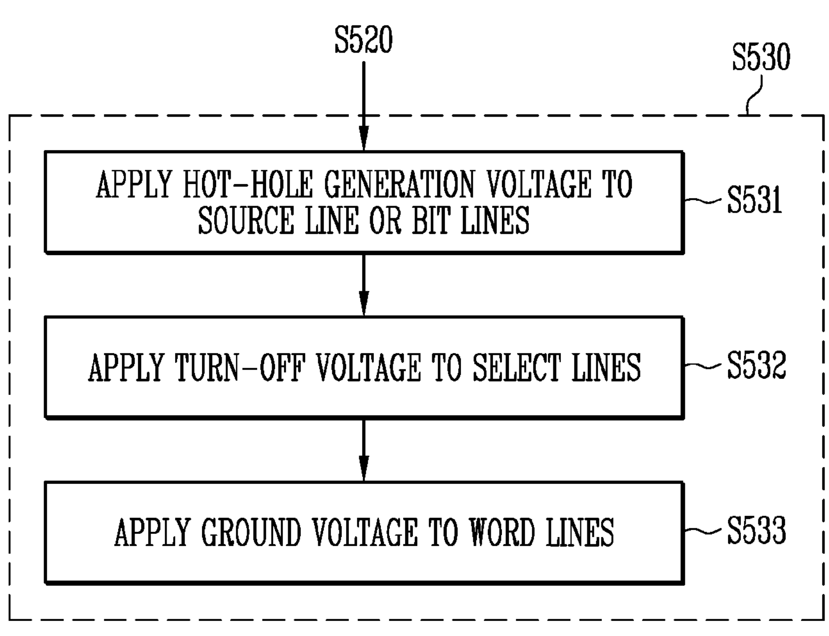
FIG. 6 is a flowchart illustrating in detail an abnormally injected electron removal operation (step S530 of FIG. 5) according to an embodiment of the present disclosure.

FIG. 6 is a flowchart illustrating in detail an abnormally injected electron removal operation (step S530 of FIG. 5) according to an embodiment of the present disclosure.

Figure 7:
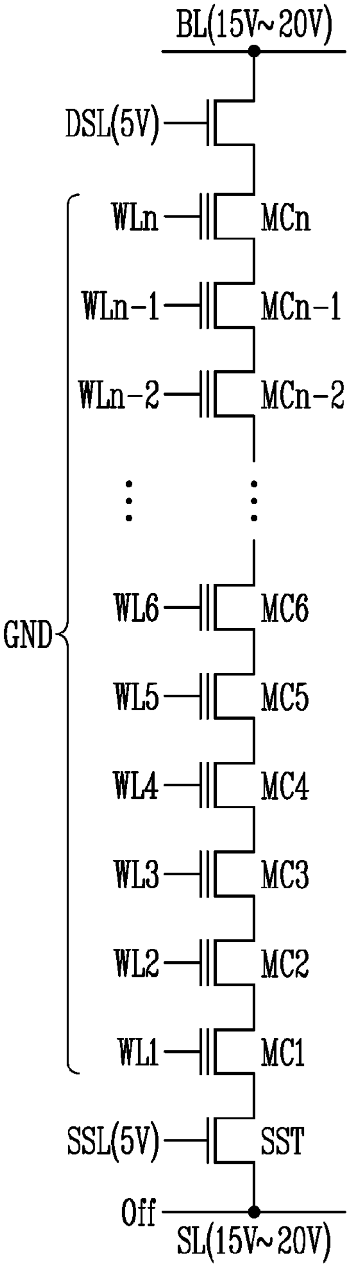
FIGS. 7, 8A, and 8B are diagrams illustrating an abnormally injected electron removal operation according to an embodiment of the present disclosure.
Figure 8A:
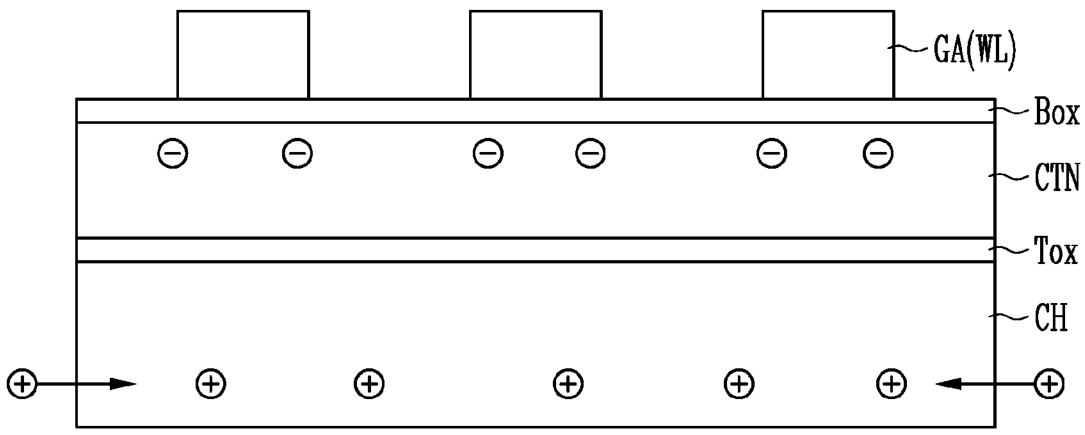
Figure 8B:
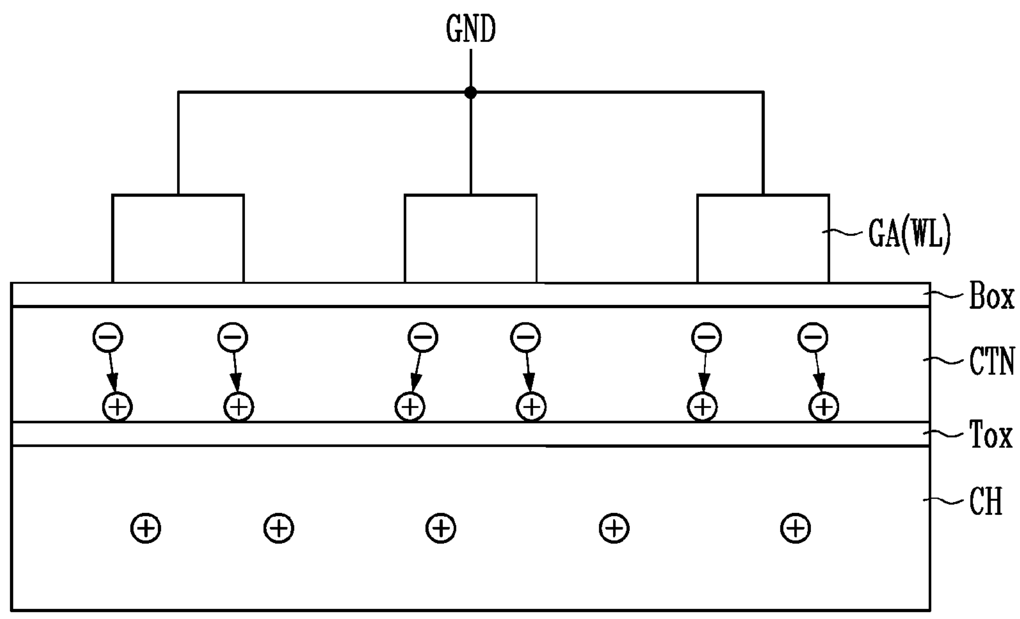

FIGS. 7, 8A, and 8B are diagrams illustrating the abnormally injected electron removal operation according to an embodiment of the present disclosure.

The abnormally injected electron removal operation according to the embodiment of the present disclosure will be described below with reference to FIGS. 2, 6, 7, 8A and 8B.

At step S531, the peripheral circuits 200 may apply a hot-hole generation voltage to either or both of the bit lines BL1 to BLm and the source line SL of the selected memory block MB1 under the control of the abnormally injected electron removal operation controller 310. The hot-hole generation voltage may be a high voltage ranging from 15 V to 20 V.

At step S532, the voltage generation circuit 210 may generate a turn-off voltage to be applied to a first select line and a second select line, and the row decoder 220 may apply the turn-off voltage to the source select line SSL and the drain select line DSL of the selected memory block MB1. The turn-off voltage may be a voltage lower than the hot-hole generation voltage and may be in a range of, for example, 0 V to 5 V. Due to a potential difference between the high-level hot-hole generation voltage applied to the source line SL and the turn-off voltage applied to the source select line SSL, the source select transistor SST of the selected memory block MB1 may be turned off, and GIDL may occur in the channel of the source select transistor SST. Similarly, due to a potential difference between the high-level hot-hole generation voltage applied to the bit line BL and the turn-off voltage applied to the drain select line DSL, the drain select transistor DST of the selected memory block MB1 may be turned off, and GIDL may occur in the channel of the drain select transistor DST.

At step S533, the row decoder 220 may apply a ground voltage GND to the word lines WL1 to WLn of the selected memory block MB1. As a result, hot holes generated in the lower channel of the source select transistor SST and the lower channel of the drain select transistor DST may flow into the channel of a memory string, thus increasing the channel potential level of the memory string. Depending on the channel potential of the memory string, abnormally injected electrons trapped in the charge storage layer of the memory cells may be transferred to a charge storage layer adjacent to a tunnel insulating layer and may be combined with holes generated in the charge storage layer adjacent to the tunnel insulating layer during a previous erase operation and then be removed.

Referring to FIG. 8A, hot holes (+) generated in the source select transistor and the drain select transistor due to a GIDL phenomenon may flow into the channel CH of the memory string, thus increasing the potential of the channel CH.

Referring to FIG. 8B, abnormally injected electrons (−) trapped in a charge storage layer CTN due to the increased potential of the channel CH may be transferred to a region adjacent to a tunnel insulating layer Tox. The abnormally injected electrons (−) transferred to the region adjacent to the tunnel insulating layer Tox of the charge storage layer CTN may be combined with holes (+) formed in a previous erase operation and may then be removed.

As described above, the abnormally injected electrons trapped in the charge storage layer CTN by tunneling a blocking insulating layer Box from a gate electrode GA based on an erase voltage may be removed through the abnormally injected electron removal operation.

In the above-described embodiment of the present disclosure, the channel potential of the memory string may be increased by injecting hot holes into the channel of the memory string included in the selected memory block by using a GIDL method, and abnormally injected electrons trapped in the charge storage layer may be transferred to a region adjacent to the tunnel insulating layer based on the increased channel potential and then may be combined with holes. Accordingly, the abnormally injected electrons may be removed.

In an additional embodiment of the present disclosure, abnormally injected electrons in the charge storage layer may be removed by directly applying a high voltage to the channel of the memory string.

Figure 9:
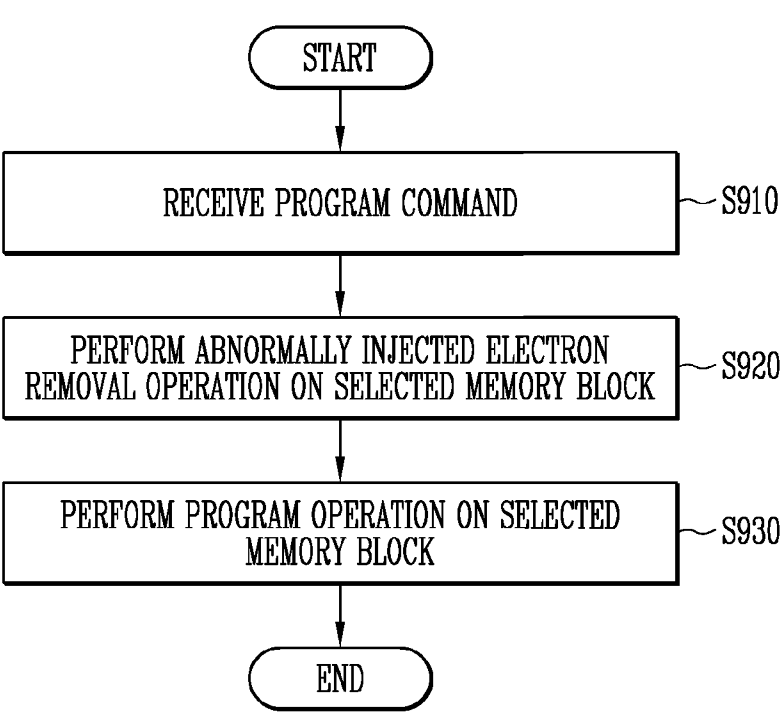
FIG. 9 is a flowchart illustrating a program operation of a memory device according to an embodiment of the present disclosure.

FIG. 9 is a flowchart illustrating a program operation of a memory device according to an embodiment of the present disclosure.

The program operation of the memory device according to the embodiment of the present disclosure will be described below with reference to FIGS. 1 to 4 and 9.

At step S910, the memory device 1100 may receive a command CMD corresponding to a program operation and an address ADD corresponding to a memory block on which the program operation is to be performed. The command CMD and the address ADD may be received from the memory controller 1200.

The control logic 300 of the memory device 1100 may control the peripheral circuits 200, specifically, the input/output circuit 250, to output the command CMD and the address ADD corresponding to the program operation to the control logic 300 and to perform the program operation on a selected memory block (e.g., MB1) corresponding to the address ADD.

The selected memory block MB1 may be an erased memory block on which an erase operation has been performed. A back-tunneling phenomenon occurs in the memory cells MC1 to MCn included in the selected memory block MB1 due to the erase voltage applied during the erase operation, and thus, abnormally injected electrons may be trapped in the charge storage layer of the memory cells MC1 to MCn.

At step S920, the control logic 300 may perform an abnormally injected electron removal operation on the selected memory block before the program operation is performed in response to the received command CMD corresponding to the program operation. It is better to perform the abnormally injected electron removal operation before the program operation is performed on the selected memory block MB1. The abnormally injected electron removal operation may be performed to remove abnormally injected electrons trapped in the charge storage layer of memory cells MC1 to MCn included in the selected memory block MB1.

The abnormally injected electron removal operation may be performed in the same manner as the abnormally injected electron removal operation described with reference to FIGS. 6, 7, 8A, and 8B.

At step S930, a program operation may be performed on the selected memory block on which the abnormally injected electron removal operation has been completed.

For example, the page buffer group 230 may adjust the potential levels of the bit lines BL1 to BLm based on data DATA received through the input/output circuit 250 and the column decoder 240. The voltage generation circuit 210 may generate and output a program voltage, and the row decoder 220 may perform the program operation by applying the program voltage to the selected word line (e.g., WL1), among the selected memory block MB1.

Figure 10:
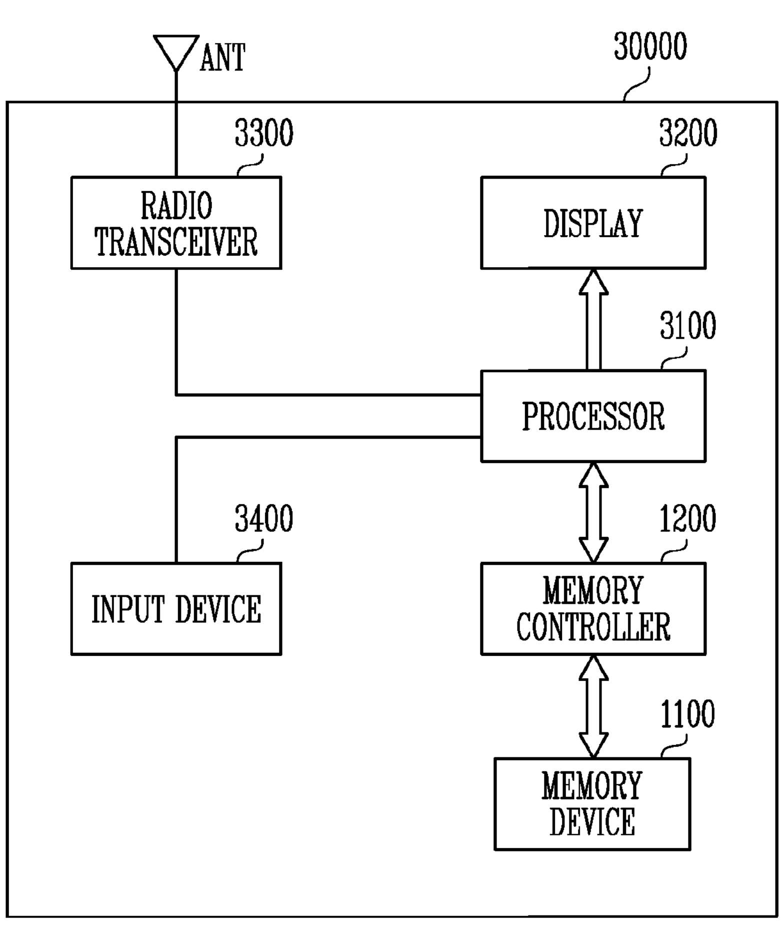
FIG. 10 is a diagram illustrating an embodiment of a memory system having the memory device of FIG. 2.

FIG. 10 is a diagram illustrating an embodiment of a memory system having the memory device of FIG. 2.

Referring to FIG. 10, a memory system 30000 may be implemented as a cellular phone, a smart phone, a tablet PC, a personal digital assistant (PDA) or a wireless communication device. The memory system 30000 may include a memory device 1100 and a memory controller 1200 that is capable of controlling the operation of the memory device 1100. The memory controller 1200 may control a data access operation of the memory device 1100, for example, a program operation, an erase operation, or a read operation, under the control of a processor 3100. Further, the memory device 1100 may perform an abnormally injected electron removal operation during the program operation or the erase operation.

Data programmed to the memory device 1100 may be output via a display 3200 under the control of the memory controller 1200.

A radio transceiver 3300 may exchange radio signals through an antenna ANT. For example, the radio transceiver 3300 may convert radio signals received through the antenna ANT into signals that may be processed by the processor 3100. Therefore, the processor 3100 may process the signals output from the radio transceiver 3300 and may transmit the processed signals to the memory controller 1200 or the display 3200. The memory controller 1200 may program the signals processed by the processor 3100 to the memory device 1100. Further, the radio transceiver 3300 may convert signals output from the processor 3100 into radio signals and may output the radio signals to an external device through the antenna ANT. An input device 3400 may be used to input a control signal that controls the operation of the processor 3100 or data to be processed by the processor 3100. The input device 3400 may be implemented as a pointing device, such as a touch pad or a computer mouse, a keypad, or a keyboard. The processor 3100 may control the operation of the display 3200 so that data output from the memory controller 1200, data output from the radio transceiver 3300, or data output from the input device 3400 is output via the display 3200.

In an embodiment, the memory controller 1200 capable of controlling the operation of the memory device 1100 may be implemented as a part of the processor 3100 or as a chip separate from the processor 3100.

Figure 11:
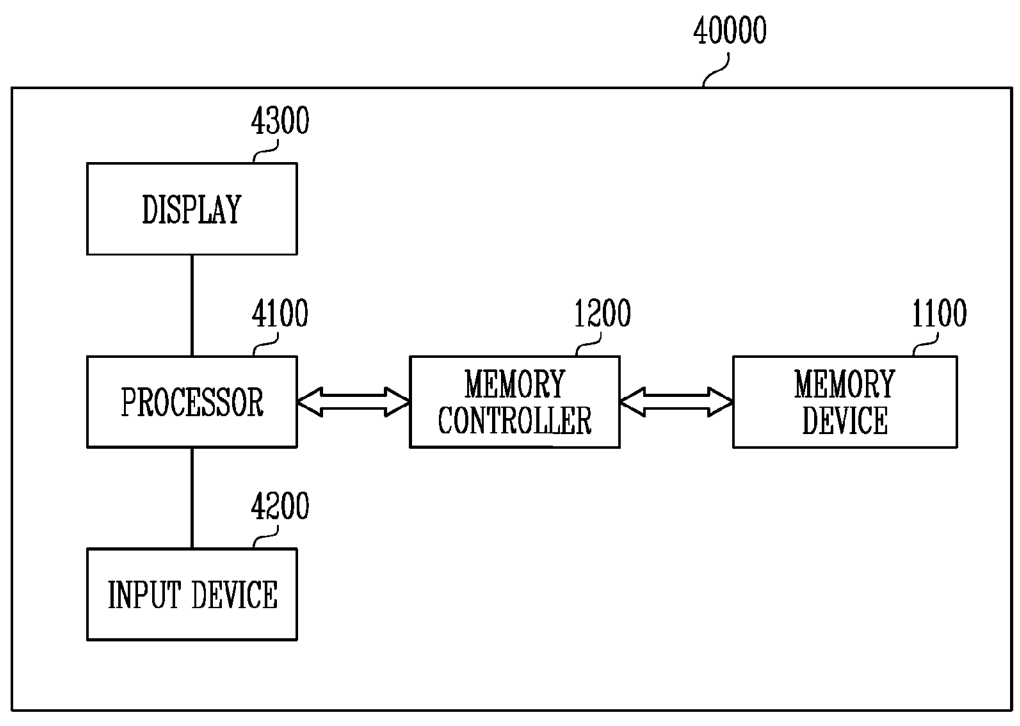
FIG. 11 is a diagram illustrating an embodiment of a memory system having the memory device of FIG. 2.

FIG. 11 is a diagram illustrating an embodiment of a memory system having the memory device of FIG. 2.

Referring to FIG. 11, a memory system 40000 may be implemented as a personal computer, a tablet PC, a net-book, an e-reader, a personal digital assistant (PDA), a portable multimedia player (PMP), an MP3 player, or an MP4 player.

The memory system 40000 may include a memory device 1100 and a memory controller 1200 that is capable of controlling a data processing operation of the memory device 1100. The memory device 1100 may perform a data access operation, for example, a program operation, an erase operation, or a read operation, and may perform an abnormally injected electron removal operation during the program operation or the erase operation, under the control of the memory controller 1200.

A processor 4100 may output data, stored in the memory device 1100, via a display 4300 according to data input through an input device 4200. For example, the input device 4200 may be implemented as a pointing device, such as a touch pad or a computer mouse, a keypad, or a keyboard.

The processor 4100 may control the overall operation of the memory system 40000 and may control the operation of the memory controller 1200. In an embodiment, the memory controller 1200 capable of controlling the operation of the memory device 1100 may be implemented as a part of the processor 4100 or as a chip separate from the processor 4100.

Figure 12:
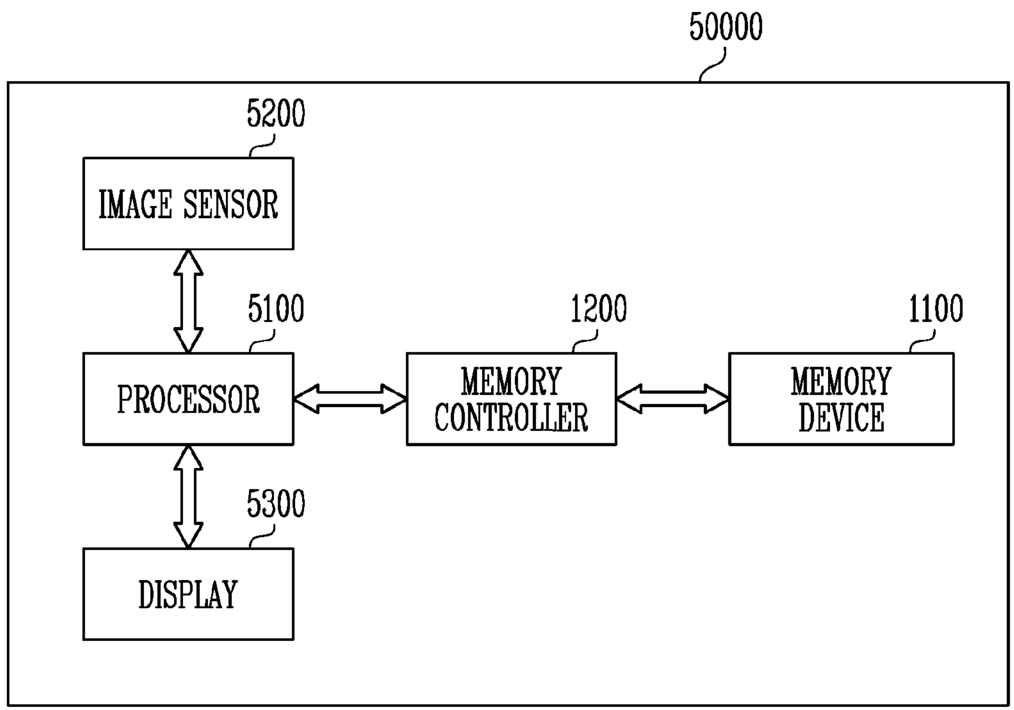
FIG. 12 is a diagram illustrating an embodiment of a memory system having the memory device of FIG. 2.

FIG. 12 is a diagram illustrating an embodiment of a memory system having the memory device of FIG. 2.

Referring to FIG. 12, a memory system 50000 may be implemented as an image processing device, e.g., a digital camera, a mobile phone provided with a digital camera, a smartphone provided with a digital camera, or a tablet PC provided with a digital camera.

The memory system 50000 may include a memory device 1100 and a memory controller 1200 that is capable of controlling a data processing operation of the memory device 1100, for example, a program operation, an erase operation, or a read operation, and the memory device 1100 may perform an abnormally injected electron removal operation during the program operation or the erase operation.

An image sensor 5200 of the memory system 50000 may convert an optical image into digital signals, and the converted digital signals may be transmitted to a processor 5100 or the memory controller 1200. The converted digital signals may be output via a display 5300 or may be stored in the memory device 1100 through the memory controller 1200, under the control of the processor 5100. Furthermore, data stored in the memory device 1100 may be output via the display 5300 under the control of the processor 5100 or the memory controller 1200.

In an embodiment, the memory controller 1200 capable of controlling the operation of the memory device 1100 may be implemented as a part of the processor 5100 or as a chip separate from the processor 5100.

Figure 13:
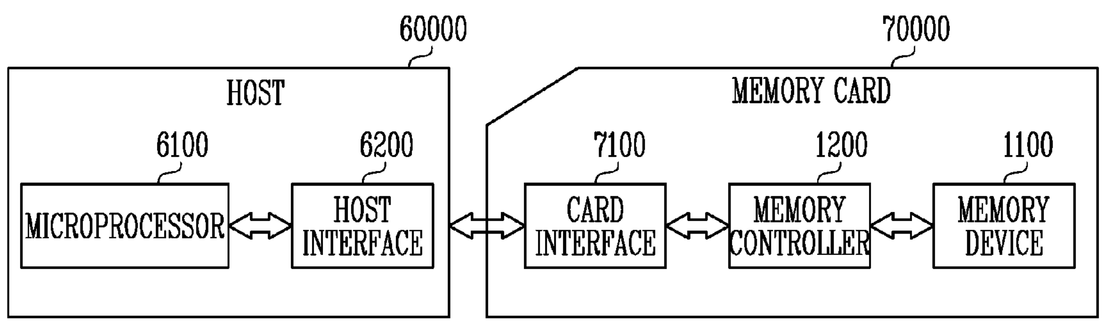
FIG. 13 is a diagram illustrating an embodiment of a memory system having the memory device of FIG. 2.

FIG. 13 is a diagram illustrating an embodiment of a memory system having the memory device of FIG. 2.

Referring to FIG. 13, a memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In an embodiment, the card interface 7100 may be, but is not limited to, a secure digital (SD) card interface or a multi-media card (MMC) interface.

The card interface 7100 may interface data exchange between a host 60000 and the memory controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol that is used by the host 60000, software installed in the hardware, or a signal transmission method performed by the hardware.

When the memory system 70000 is coupled to a host interface 6200 of the host 60000, such as a PC, a tablet PC, a digital camera, a digital audio player, a mobile phone, console video game hardware, or a digital set-top box, the host interface 6200 may perform data communication with the memory device 1100 through the card interface 7100 and the memory controller 1200 under the control of a microprocessor 6100.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

According to the present disclosure, the reliability of a memory device may be improved by minimizing deterioration of threshold voltage distributions attributable to a back-tunneling phenomenon that may occur during an erase operation.

What is claimed is:

1. A memory device, comprising:

a memory block including a plurality of memory strings;

a peripheral circuit configured to perform an erase operation and a program operation on the memory block; and a control logic configured to control the peripheral circuit to perform the erase operation and the program operation on the memory block, wherein the control logic is configured to control the peripheral circuit to perform an abnormally injected electron removal operation that removes abnormally injected electrons trapped in a charge storage layer of a plurality of memory cells included in the memory block after the erase operation has been completed, wherein, during the abnormally injected electron removal operation, the peripheral circuit is configured to:

apply a hot-hole generation voltage having a high potential to either or both of a source line and bit lines coupled to the memory block, and apply a turn-off voltage to select lines coupled to select transistors included in the plurality of memory strings, thereby generating hot holes in a channel of the select transistors.

2. The memory device according to claim 1, wherein the peripheral circuit is configured to:

apply a ground voltage to word lines coupled to the memory block to allow the hot holes to flow into channels of the plurality of memory strings, thereby increasing channel potentials of the plurality of memory strings, and transfer the abnormally injected electrons trapped in the charge storage layer toward a tunnel insulating layer adjacent to the charge storage layer based on the channel potentials of the plurality of memory strings, thereby allowing the abnormally injected electrons to be combined with holes generated in the erase operation and to be removed.

3. The memory device according to claim 1, wherein the hot-hole generation voltage ranges from 15 V to 20 V.

4. The memory device according to claim 1, wherein the turn-off voltage is a voltage lower than the hot-hole generation voltage.

5. The memory device according to claim 1, wherein the turn-off voltage ranges from 0 V to 5 V.

6. The memory device according to claim 1, wherein the control logic is configured to control the peripheral circuit to perform the program operation after the abnormally injected electron removal operation has been completed.

7. A memory device, comprising:

a memory block including a plurality of memory strings;

a peripheral circuit configured to perform an erase operation and a program operation on the memory block; and a control logic configured to control the peripheral circuit to perform the erase operation and the program operation on the memory block, wherein the control logic is configured to control the peripheral circuit to perform an abnormally injected electron removal operation on the memory block in an erase state, before performing the program operation on the memory block, and wherein the abnormally injected electron removal operation is an operation that removes abnormally injected electrons trapped in a charge storage layer of a plurality of memory cells included in the memory block, wherein, during the abnormally injected electron removal operation, the peripheral circuit is configured to:

apply a hot-hole generation voltage having a high potential to either or both of a source line and bit lines coupled to the memory block, and apply a turn-off voltage to select lines coupled to select transistors included in the plurality of memory strings, thereby generating hot holes in a channel of the select transistors.

8. The memory device according to claim 7, wherein the peripheral circuit is configured to:

apply a ground voltage to word lines coupled to the memory block to allow the hot holes to flow into channels of the plurality of memory strings, thereby increasing channel potentials of the plurality of memory strings, and transfer the abnormally injected electrons trapped in the charge storage layer toward a tunnel insulating layer adjacent to the charge storage layer based on the channel potentials of the plurality of memory strings, thereby allowing the abnormally injected electrons to be combined with holes generated in the erase operation and to be removed.

9. The memory device according to claim 7, wherein the hot-hole generation voltage ranges from 15 V to 20 V.

10. The memory device according to claim 7, wherein the turn-off voltage is a voltage lower than the hot-hole generation voltage.

11. The memory device according to claim 7, wherein the turn-off voltage ranges from 0 V to 5 V.

12. A method of operating a memory device, comprising:

receiving, by the memory device, an erase command from an external device and performing an erase operation on a selected memory block in response to the received erase command; and performing an abnormally injected electron removal operation on the selected memory block on which the erase operation has been completed, wherein the abnormally injected electron removal operation is an operation that removes abnormally injected electrons trapped in a charge storage layer of memory cells included in the selected memory block due to a back-tunneling phenomenon during the erase operation, wherein the abnormally injected electron removal operation comprises:

applying a hot-hole generation voltage having a high potential to either or both of a source line and bit lines coupled to the selected memory block; and generating hot holes in a channel of select transistors included in the selected memory block by applying a turn-off voltage to select lines coupled to the select transistors.

13. The method according to claim 12, wherein the abnormally injected electron removal operation further comprises:

applying a ground voltage to word lines coupled to the selected memory block to allow the hot holes to flow into a channel of a memory string, thereby increasing a channel potential of the memory string, and wherein the abnormally injected electrons trapped in the charge storage layer are transferred toward a tunnel insulating layer adjacent to the charge storage layer based on the channel potential of the memory string, combined with holes generated in the erase operation, and then removed.

14. The method according to claim 12, wherein the hot-hole generation voltage ranges from 15 V to 20 V.

15. The method according to claim 12, wherein the turn-off voltage is a voltage lower than the hot-hole generation voltage.

16. The method according to claim 12, wherein the turn-off voltage ranges from 0 V to 5 V.

17. A method of operating a memory device, comprising:

receiving a program command from an external device of the memory device and performing an abnormally injected electron removal operation on a selected memory block in response to the received program command; and performing a program operation on the selected memory block on which the abnormally injected electron removal operation has been completed, wherein the abnormally injected electron removal operation is an operation that removes abnormally injected electrons trapped in a charge storage layer of memory cells included in the selected memory block due to a back-tunneling phenomenon during the erase operation, wherein the abnormally injected electron removal operation comprises:

applying a hot-hole generation voltage having a high potential to either or both of a source line and bit lines coupled to the selected memory block; and generating hot holes in a channel of select transistors included in the selected memory block by applying a turn-off voltage to select lines coupled to the select transistors.

18. The method according to claim 17, wherein the abnormally injected electron removal operation further comprises:

applying a ground voltage to word lines coupled to the selected memory block to allow the hot holes to flow into a channel of a memory string, thereby increasing a channel potential of the memory string, and wherein the abnormally injected electrons trapped in the charge storage layer are transferred toward a tunnel insulating layer adjacent to the charge storage layer based on the channel potential of the memory string, combined with holes generated in the erase operation, and then removed.

* * * * *